(12) United States Patent
Polarouthu et al.

(10) Patent No.: US 8,823,341 B2
(45) Date of Patent: Sep. 2, 2014

(54) SWITCHED AND LINEAR DC-DC CONVERTER WITH OUTPUT INDUCTOR DETECTION MODULE

(71) Applicant: Texas Instruments Incorporated, Dallas, TX (US)

(72) Inventors: Sudhir Polarouthu, Hyderabad (IN); Suresh Mallala, Bangalore (IN); Ranjit Kumar Dash, Bangalore (IN); Sundara Siva Rao Giduturi, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 23 days.

(21) Appl. No.: 13/658,781

(22) Filed: Oct. 23, 2012

(65) Prior Publication Data

US 2014/0111169 A1   Apr. 24, 2014

(51) Int. Cl.
   *G05F 1/00* (2006.01)
(52) U.S. Cl.
   USPC .......................... 323/265; 323/273; 323/282

(58) Field of Classification Search
   USPC .......... 323/222, 265, 271, 273, 274, 282, 283, 323/284, 285
   See application file for complete search history.

(56) References Cited

U.S. PATENT DOCUMENTS

| 2012/0161732 A1* | 6/2012 | Renton et al. ............... 323/275 |
| 2012/0206125 A1* | 8/2012 | Apriletti et al. ............. 323/351 |
| 2012/0223686 A1* | 9/2012 | Lin et al. .................... 323/270 |

\* cited by examiner

*Primary Examiner* — Nguyen Tran
(74) *Attorney, Agent, or Firm* — Lawrence J. Bassuk; Frederick J. Telecky, Jr.

(57) ABSTRACT

The systems and methods of auto-configurable switching/linear regulation disclosed herein enable a device to operate in both DC-to-DC switching regulation and linear regulation applications. The systems and methods disclosed herein differentiate between switching and linear mode. If the application is for a linear regulator, there will only be a capacitor on the output. If the application is for switching mode regulation, there will be an inductor and a capacitor on the output. Then based on the determination, the mode is selected and the hardware is converted into switching regulator operation or linear regulator operation.

3 Claims, 4 Drawing Sheets

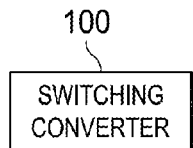
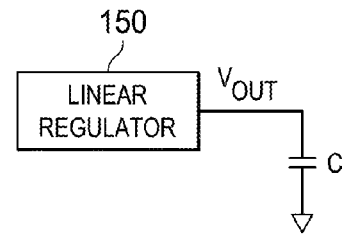
FIG. 1A
FIG. 1B
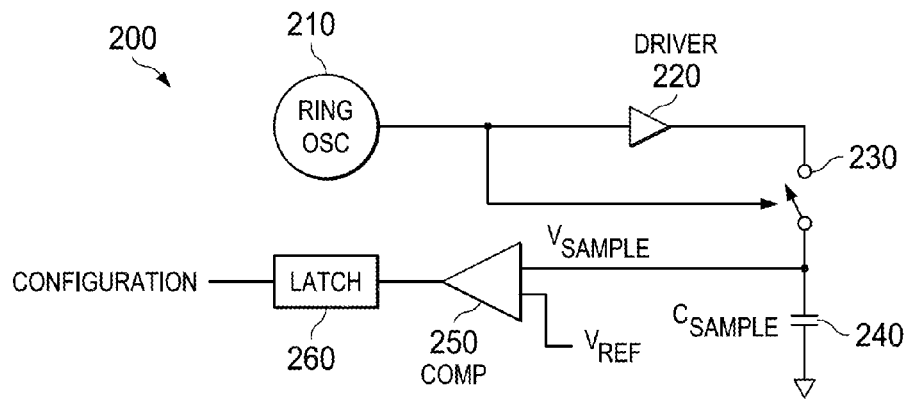
FIG. 2
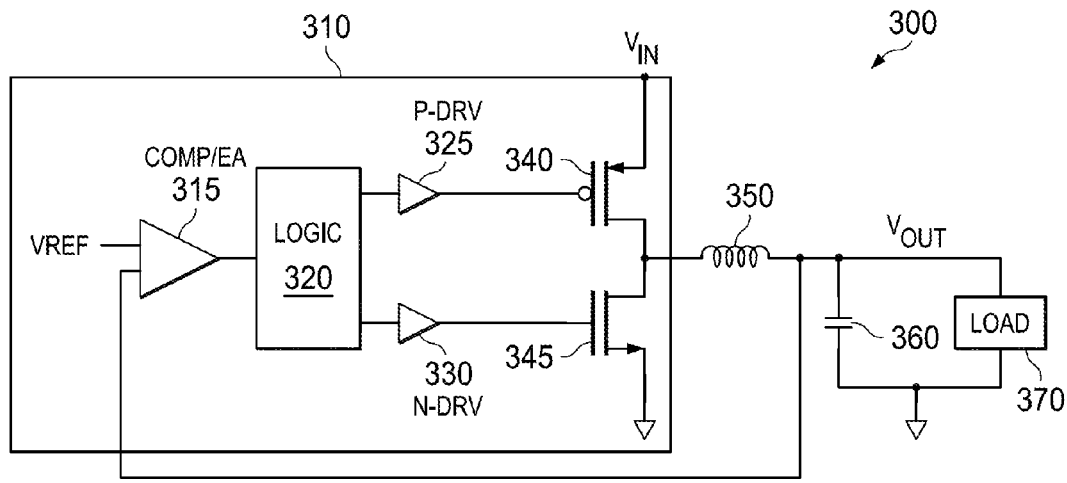
FIG. 3A

_US 8,823,341 B2_

SWITCHED AND LINEAR DC-DC CONVERTER WITH OUTPUT INDUCTOR DETECTION MODULE

TECHNICAL FIELD

The present disclosure is generally related to electronics and, more particularly, is related to a voltage regulator.

BACKGROUND

A DC-to-DC converter is an electronic circuit which converts a source of direct current (DC) from one voltage level to another. DC to DC converters are important in portable electronic devices such as cellular phones and laptop computers. Such electronic devices often contain several sub-circuits, each with its own voltage level requirement different from that supplied by the battery or an external supply (sometimes higher or lower than the supply voltage). Additionally, a battery voltage declines as its stored power is drained. Switched DC to DC converters offer a method to increase voltage from a partially lowered battery voltage thereby saving space instead of using multiple batteries to accomplish the same thing.

Most DC to DC converters also regulate the output voltage. Some exceptions include high-efficiency LED power sources, which are a kind of DC to DC converter, that regulate the current through the LEDs, and simple charge pumps which double or triple the input voltage. Linear regulators can only output at lower voltages from the input. They are very inefficient when the voltage drop is large and the current is high as they dissipate heat equal to the product of the output current and the voltage drop; consequently they are not normally used for large-drop high-current applications. The inefficiency wastes power and requires higher-rated and consequently more expensive and larger components. The heat dissipated by high-power supplies is a problem in itself and it must be removed from the circuitry to prevent unacceptable temperature rises.

Linear regulators are practical if the current is low, the power dissipated being small, although it may still be a large fraction of the total power consumed. They are often used as part of a simple regulated power supply for higher currents: a transformer generates a voltage which, when rectified, is a little higher than that needed to bias the linear regulator. The linear regulator drops the excess voltage, reducing hum-generating ripple current and providing a constant output voltage independent of normal fluctuations of the unregulated input voltage from the transformer/bridge rectifier circuit and of the load current.

Linear regulators are inexpensive, reliable if good heat sinks are used and much simpler than switching regulators. As part of a power supply, they may require a transformer, which is larger for a given power level than that required by a switch-mode power supply. Linear regulators can provide a very low-noise output voltage, and are very suitable for powering noise-sensitive low-power analog and radio frequency circuits. A popular design approach is to use an LDO, Low Drop-out Regulator, that provides a local "point of load" DC supply to a low power circuit.

Electronic switch-mode DC to DC converters convert one DC voltage level to another, by storing the input energy temporarily and then releasing that energy to the output at a different voltage. The storage may be in either magnetic field storage components (inductors, transformers) or electric field storage components (capacitors). This conversion method is more power efficient (often 75% to 98%) than linear voltage regulation (which dissipates unwanted power as heat). This efficiency is beneficial to increasing the running time of battery operated devices. The efficiency has increased due to the use of power FETs, which are able to switch at high frequency more efficiently than power bipolar transistors, which incur more switching losses and require a more complicated drive circuit. Another important innovation in DC-DC converters is the use of synchronous rectification replacing the flywheel diode with a power FET with low "on resistance", thereby reducing switching losses. Drawbacks of switching converters include complexity, electronic noise (EMI/RFI), and to some extent cost, although this has decreased with advances in chip design.

There are heretofore unaddressed needs with previous solutions in providing power regulation when both linear and switching regulation may be desired.

SUMMARY

Example embodiments of the present disclosure provide systems of auto-configurable switching/linear regulation. Briefly described, in architecture, one example embodiment of the system, among others, can be implemented as follows: a DC-DC converter comprising: a comparator/error amplifier; a logic module; a high-side driver; and a low-side driver, the logic module configured to switch between the high-side driver and the low-side driver in switching mode and configured to only drive the high-side driver or the low-side driver in linear mode.

Embodiments of the present disclosure can also be viewed as providing methods of auto-configurable switching/linear regulation. In this regard, one embodiment of such a method, among others, can be broadly summarized by the following steps: selecting between switching mode and linear mode for a DC-DC converter, the DC-DC converter comprising a high-side driver and a low-side driver, switching mode further comprising alternatively switching the high-side driver and the low-side driver, linear mode further comprising only driving the high-side driver.

BRIEF DESCRIPTION OF THE DRAWINGS

FIG. 1A is a circuit diagram of a switching converter.

FIG. 1B is a circuit diagram of a linear converter.

FIG. 2 is a circuit diagram of an example embodiment of a mode determination circuit.

FIG. 3A is a circuit diagram of an example embodiment of a system of auto-configurable switching/linear regulation in switching mode.

DETAILED DESCRIPTION

Figure 3B:
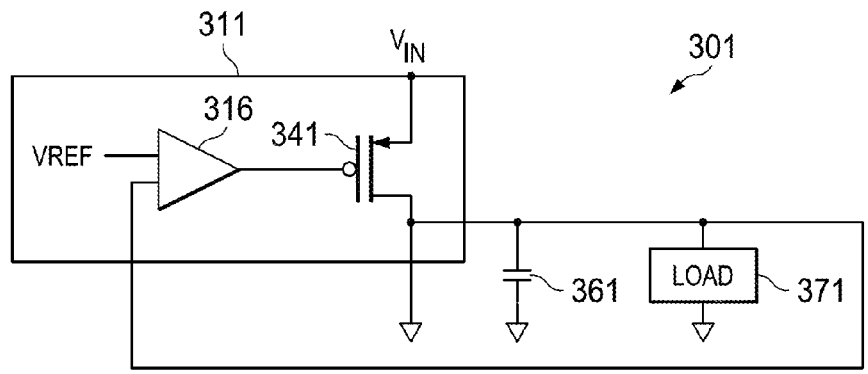
FIG. 3B is a circuit diagram of an example embodiment of a system of auto-configurable switching/linear regulation in linear mode.

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

Voltage regulators are required in many applications. Two of the most prevalent types of voltage regulators are linear regulators and switching regulators. As provided in FIG. 1A, switching regulator 100 requires an inductor and a capacitor at its output to filter the switching output voltage. Switching regulator 100 offers much higher power efficiency than a linear regulator. A switching regulator may be up to 90% efficient across the input and output voltage range. A switching converter with a Vin of 1.8V and Vout of 1V can achieve 85-90% efficiency which results in only 15% of the power being converted into heat. Therefore, using switching regulator 100 saves overall power of the system. However, with switching regulator 100, additional passive devices are used—for example, an inductor and a capacitor. The inductor tends to be very large depending on the power that the load demands.

As provided in FIG. 1B, linear regulator 150 requires only a capacitor on the output. Linear regulators are used in applications requiring low cost and which might or might not require an external capacitor. The output capacitor depends on the load transient profile. When the load changes, if the regulator cannot respond to the load change immediately, some storage element (a capacitor) is used at the output of the regulator to supply charge until the regulator can catch up to the demand.

Linear regulator 150 is typically a very low cost design due to the extremely low area and the need for no, or one, external capacitor. However, linear regulator 150 may provide low power efficiency, which is the ratio of Vout divided by Vin. So, for example, if Vout is 1V and Vin is 1.8V, the power efficiency is 60%, resulting in the remaining 40% of the power being converted into heat. This heating of the semiconductor die may be undesirable in some applications.

In some applications, for example, an end equipment manufacturer may have a power supply node which may be configured as a switching regulator or a linear regulator depending on the requirements of the customer. The systems and methods of auto-configurable switching/linear regulation disclosed herein modify the same converter to operate as a linear regulator or switching regulator dependent on the requirements of the customer.

In an example embodiment, the same device may operate as a DC-to-DC switching regulator or as a linear regulator. However, in previous solutions, software may have been notified whether the application requires a linear regulator or a switching regulator. If the software is notified that a linear regulator is required, then it configures the hardware for a linear regulator; and if it is notified that it is a switching regulator, then it configures the hardware for a switching regulator. However, the disadvantage of this method of configuring is that two different software algorithms are used for two different customers. If the switching regulator is the main regulator that powers up the chip, the software has to power up before the hardware and this solution cannot be applied. The systems and methods of auto-configurable switching/linear regulation disclosed herein differentiate before the start-up of the regulator in either mode to identify how it is to be configured on the customer application. If the application is for a linear regulator, there will not be an inductor on the output; there will only be a capacitor. The determination is made to detect between only a capacitor and an inductor and a capacitor. Then based on the determination, the mode is selected. Then the hardware is converted into DC-to-DC converter operation or linear regulator operation.

FIG. 2 provides circuit 200 of an example embodiment for determining whether the output is configured as a switching or linear regulator. Circuit 200 includes ring oscillator 210, driver 220, switch 230, sampling capacitor 240, sampling comparator 250 and latch 260. To detect/differentiate the inductor/capacitor and the capacitor only on the output, ring oscillator 210, for example operating at 50 MHZ, a relatively high frequency, may be used to drive the output load with driver 220. Switch 230 is used to sample the output of driver 220. Switch 230 may be switched at the same frequency as ring oscillator 210. As switch 230 is switched the output voltage is sampled on sample capacitor 240. That sampled voltage is compared to a reference voltage with sample comparator 250 at a predetermined time and latched with latch 260.

The voltage on sample capacitor 240 will exhibit different behavior when it is being filtered by a capacitor only filter than it will when it is being filtered by an inductor/capacitor filter. If an inductor/capacitor filter is present, it will cause the voltage on sample capacitor 240 to rise and settle to the supply voltage of driver 220. If the filter is only a capacitor and Vout is switched at the high frequency, the capacitor acts as a short to the high frequency signal and Vout will be coupled to ground due to the low impedance capacitor at the high frequency. In an example embodiment, the accumulated sampled voltage is compared with a reference voltage after a predefined time and a decision is made. If the sampled voltage is high, then the converter will be configured to be a switching regulator. If the sampled voltage is low, then the converter will be configured to be a linear regulator.

The output of comparator 250 is latched and the configuration of the customer platform is determined. The hardware can then be configured as a DC-to-DC switching converter or a linear regulator. In an example application, a request from a phone manufacturer specifies an integrated DC-to-DC converter due to power efficiency concerns. The same phone is also being manufactured for another customer with price sensitivity concerns. This single device may be used depending on the customer requirements, whether a linear regulator is preferred when cost is more important or a switching regulator is preferred when efficiency is more important.

FIG. 3A provides circuit diagram 300 of an example embodiment of the disclosed systems and methods disclosed as configured for a switching regulator. Circuit diagram 300 includes regulator device 310 which includes comparator/error amplifier 315, logic block 320, P-driver 325, N-driver 330, PMOS transistor 340, and NMOS transistor 345. The output of the switching regulator is filtered with inductor 350 and capacitor 360 to drive load 370. Regulator device 310 is configured as a switching regulator with PMOS transistor 340 driven by P-driver 325 and NMOS transistor 345 driven by N-driver 330. The signals that drive P-driver 325 or N-driver 330 come from logic block 320 whose input comes from comparator 315. Comparator 315 compares the output voltage to a reference voltage and it toggles between driving PMOS transistor 340 and NMOS transistor 345. If the output falls below the reference, PMOS transistor 340 is turned on. If the output is higher than the reference, NMOS transistor 345 is turned on.

FIG. 3B provides circuit 301 of an example embodiment of the disclosed systems and methods as configured for a linear regulator. In circuit 301 includes regulator device 311 which includes comparator/error amplifier 316 and PMOS transistor 341. In converting regulator device 311 into a linear regulator, the NMOS side is turned off and the logic block and drivers are bypassed. PMOS switch 341 is used for the linear regulator and comparator/error amplifier 316 is used as an error amplifier. The compensation is slightly different if comparator/error amplifier 316 is being used as a comparator or as an error amplifier so a compensation network is switched in linear regulator mode.

Figure 4:
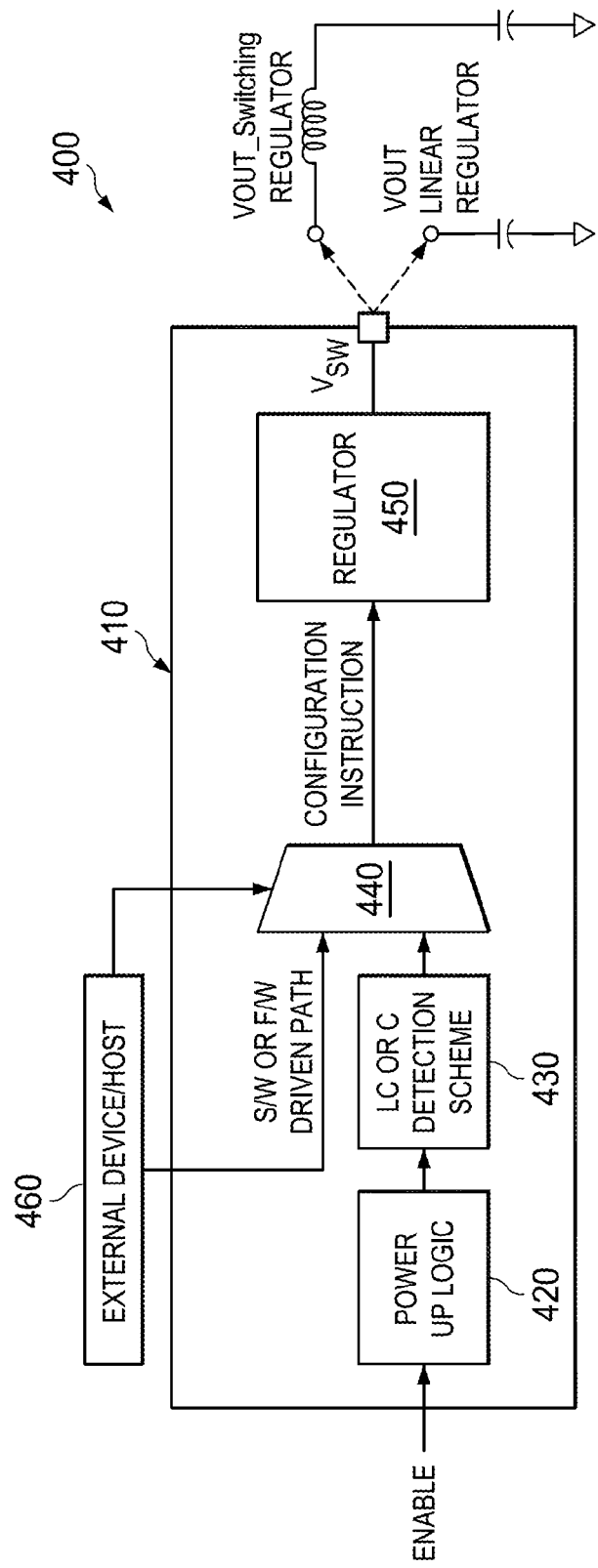
FIG. 4 is a circuit diagram of an example embodiment of a system of auto-configurable switching/linear regulation with external configuration instruction.

FIG. 4 provides block diagram 400 of an example embodiment of systems and methods of auto-configurable switching/linear regulation using an external configuration means. Auto-configurable device 410 includes power up logic 420, output filter detection module 430, multiplexer 440, and regulator 450. External device/host 460 may be used to configure the regulator. Depending on the desired configuration for regulator 450, in an example embodiment, external device/host 460 may load that information into multiplexer 440. If regulator 450 is to be configured as an LDO or switching regulator by external device/host 460, output filter detection module 430 is bypassed through multiplexer 440. If external device/host 460 does not supply the information to multiplexer 440, then the output filter is detected as either an inductor/capacitor or a capacitor only. Then that information is processed through multiplexer 440 and regulator 450 is configured.

Figure 5:
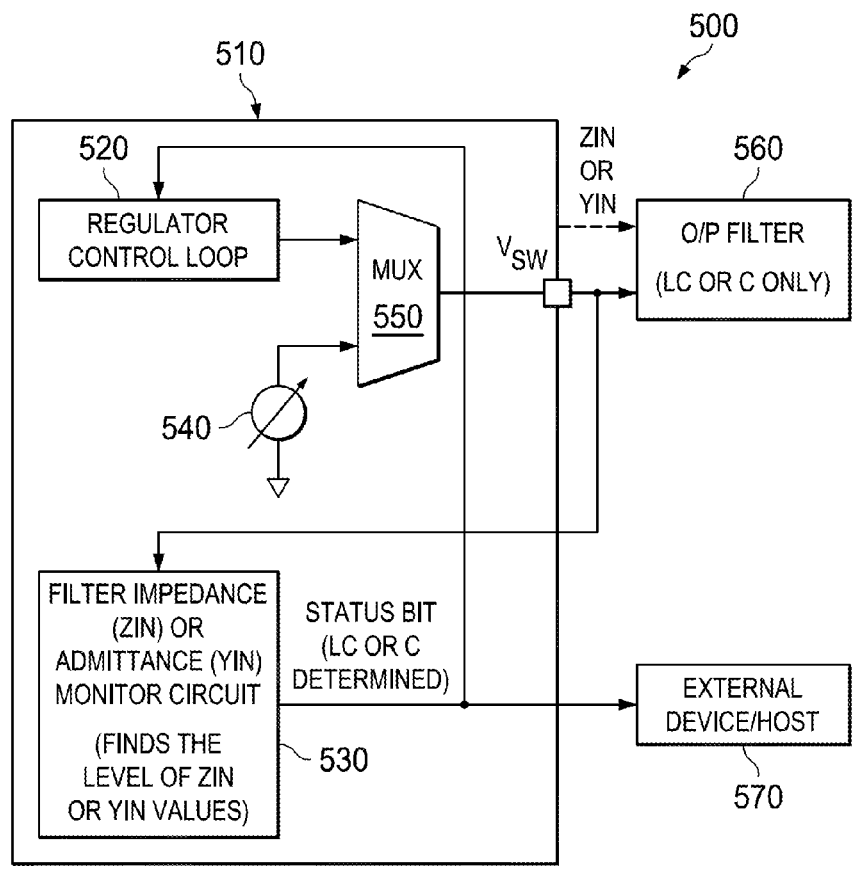
FIG. 5 is a circuit diagram of an example embodiment of a system of auto-configurable switching/linear regulation with impedance/admittance value determination.

FIG. 5 provides an example embodiment of system 500 of auto-configurable switching/linear regulation with impedance/admittance value determination. Device 510 includes regulator control loop 520, impedance monitor module 530, test signal generator 540, and multiplexer 550. The magnitude of the input impedance or admittance of output filter 560 may be determined by impedance monitor module 530. Impedance monitor module 530 may send a status bit to external device/host 570 for supplemental purposes and to regulator control loop 520 to configure the control loop dependent on the type of output filter 560 and the value of output filter 560.

The output in FIG. 5 may be controlled by regulator control loop 520 or by test signal generator 540. In the test phase, the regular operation is bypassed and a test signal is sent from test signal generator 540 through multiplexer 550 to the output. The test signal may be internally generated by test signal generator 540 or the test signal may be alternatively generated externally. When the test signal is passed to the output of device 510, the behavior of the output will determine which kind of filter is present—whether it is an inductor/capacitor or a capacitor only on the output. The impedance of the output is monitored with impedance monitor module 530 which detects the value of the impedance or the admittance at the output node. Based on the detection, a status bit is configured. That status bit may be used internally by the device or regulator control loop 520. The status bit may also be presented as an output to an external device or host which can be used for other purposes.

Non-limiting example signals output by test signal generator 540 include a square wave, a step input, a sine wave, and a step current. The value of the inductor/capacitor may be determined by determining the value of the impedance/admittance, and, based on that determination, regulator control loop 520 may be configured so that the loop dynamics of the regulator are optimized. To determine the input impedance, a comparator is used to determine if the sampled value is higher or lower than the reference. If the sampled value is higher than the reference, a first bit is set; if it's lower than the reference, a second bit is set to detect multiple ranges of inductor/capacitor or capacitor only connected to the output. The reference value may be varied, for example, with a resistor ladder and switches. Additionally, the rise time will vary based on the value of the components in output filter 560. The time that it takes for the sampled voltage to reach the output level will be different based on the components in output filter 560 on the output. In an example embodiment, a fixed test signal from test signal generator 540 is applied through multiplexer 550 to the output and the output is sampled after a fixed time. That sampled signal will have different rise times based on the output impedance. So the value of the sample after a particular time will give an indication of the impedance of output filter 560.

Figure 6:
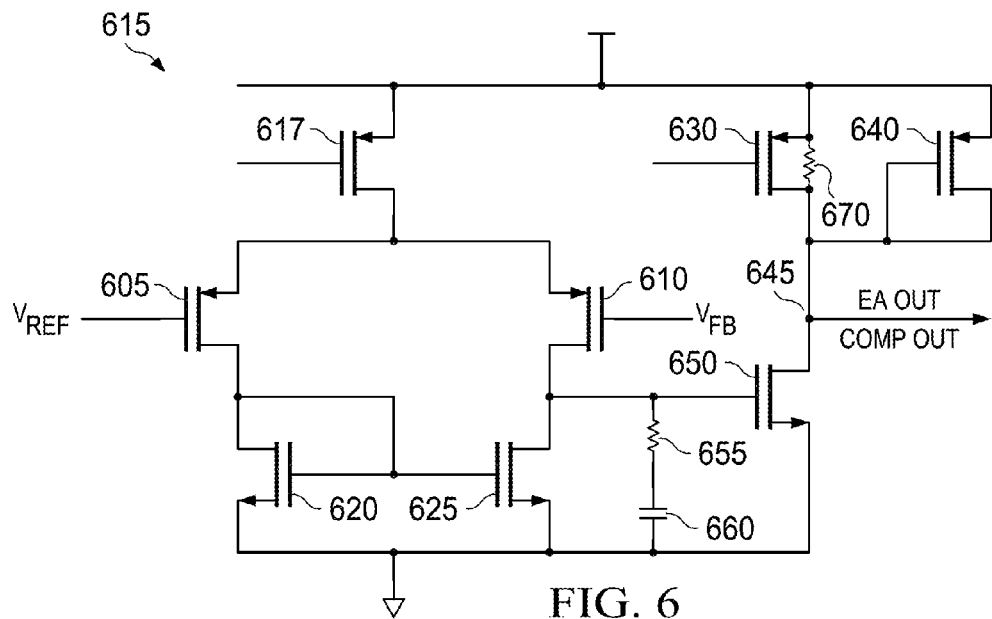
FIG. 6 is a circuit diagram of an example embodiment of the error amplifier of FIG. 3A.

FIG. 6 provides circuit diagram 615 of an example embodiment of the comparator/error amplifier with additional compensation to be switched in. In switching regulator mode, it will operate as a comparator and in linear regulator mode, it will operate as an error-amplifier. A typical comparator includes transistors 617, 605, 610, 620, 625, 650 & 630. No compensation is needed. A typical error amplifier includes transistors 617, 605, 610, 620, 625, 640, and 650. The additional compensation includes resistor 655, capacitor 660 and resistor 670. In this mode, transistor 630 is replaced with resistor 670 and transistor 640.

Figure 7:
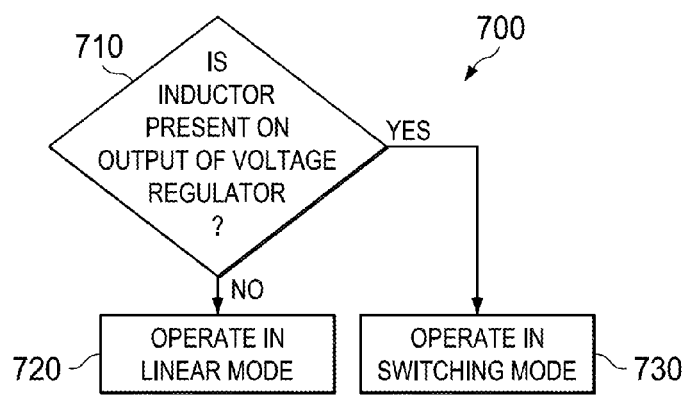
FIG. 7 is a flow diagram for an example embodiment of a method of auto-configurable switching/linear regulation.

FIG. 7 provides flowchart 700 of an example embodiment of a method of auto-configurable switching linear regulation. In block 710 a determination is made as to whether an inductor is present on the output of the voltage regulator. If an inductor is present, then in block 730, the regulator is configured to operate in switching mode. If an inductor is not present, then in block 720, the regulator is operated in linear mode.

Although the present disclosure has been described in detail, it should be understood that various changes, substitutions and alterations can be made thereto without departing from the spirit and scope of the disclosure as defined by the appended claims.

Therefore, at least the following is claimed:

1. An integrated circuit DC-DC converter comprising:
   a comparator/error amplifier;
   a high-side driver;
   a low-side driver;
   a logic module configured to switch between the high-side driver and the low-side driver in a switching mode and configured to only drive the high-side driver or the low-side driver in a linear mode; and
   a detection module coupled to the logic module and configured to determine if an inductor is present on an output of the DC-DC converter, the detection module selecting the switching mode if an inductor is present, the detection module including an oscillator configured to drive the output of the DC-DC converter and a comparator configured to compare the output of the oscillator with a reference voltage, in which after a predefined time period, the DC-DC converter operates in the switching mode if a sample output of the DC-DC converter is driven higher than the reference voltage by the oscillator and operates in the linear mode if the sampled output is driven lower than the reference voltage by the oscillator.

2. A method of operating an integrated circuit comprising:
   selecting between a switching mode and a linear mode in a DC-DC converter, the DC-DC converter including a high-side driver and a low-side driver, the switching mode including alternatively switching the high-side driver and the low-side driver, and the linear mode including only driving the high-side driver; and
   the selecting including determining if an inductor is present on an output of the DC-DC converter, and selecting the switching mode if the inductor is present, the determining including driving the output of the DC-DC converter with an oscillator and comparing the output of the DC-DC converter with a voltage reference at a predetermined time and operating the DC-DC converter in switching mode if, after a predefined time, the output is driven higher than the reference voltage by the oscillator and operating the DC-DC converter in linear mode if, after the predefined time, the output is driven lower than the reference voltage.

3. An integrated circuit comprising:

means for selecting between switching mode and linear mode for a DC-DC converter, the DC-DC converter including a high-side driver and a low-side driver, the switching mode including alternatively switching the high-side driver and the low-side driver, and the linear mode including only driving either the high-side driver or the low-side driver;

means for determining if an inductor is present on an output of the DC-DC converter, the means for determining being coupled to the means for selecting and including means for driving the output of the DC-DC converter with an oscillator and means for comparing the output of the DC-DC converter with a voltage reference, the means for selecting operating the DC-DC converter in switching mode if, after a predefined time, a sample output is driven higher than the reference voltage by the oscillator and in linear mode if, after the predefined time, the sampled output is driven lower than the reference voltage.

* * * * *